US007666696B2

(12) United States Patent
Hersee

(10) Patent No.: US 7,666,696 B2
(45) Date of Patent: Feb. 23, 2010

(54) PROCESS FOR CONTROLLING INDIUM CLUSTERING IN INGAN LEDS USING STRAIN ARRAYS

(75) Inventor: Stephen D. Hersee, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 517 days.

(21) Appl. No.: 11/557,737

(22) Filed: Nov. 8, 2006

(65) Prior Publication Data

US 2008/0123709 A1    May 29, 2008

Related U.S. Application Data

(60) Provisional application No. 60/735,199, filed on Nov. 10, 2005.

(51) Int. Cl.
*H01L 21/00* (2006.01)

(52) U.S. Cl. .................... 438/47; 257/94; 257/E33.005

(58) Field of Classification Search .................. 438/47; 257/94, E33.005
See application file for complete search history.

(56) References Cited

U.S. PATENT DOCUMENTS

| 7,485,892 B2* | 2/2009 | Ooi et al. ................ 257/14 |
| 2002/0182765 A1* | 12/2002 | Tran et al. ................ 438/29 |

* cited by examiner

*Primary Examiner*—Zandra Smith
*Assistant Examiner*—Christy L Novacek
(74) *Attorney, Agent, or Firm*—MH2 Technology Law Group

(57) ABSTRACT

Exemplary embodiments provide MQW semiconductor devices and methods for their manufacture. The MQW semiconductor devices can be formed by growing a MQW active region over a nanoscale periodic strain array. By using the nanoscale periodic strain array, the position, size, and composition of the In-rich clusters in the MQW active region can be controlled. This control of In-rich clusters can result in tighter wavelength control, which can be important for applications, such as, for example, lasers and LEDs.

6 Claims, 3 Drawing Sheets

PROCESS FOR CONTROLLING INDIUM CLUSTERING IN INGAN LEDS USING STRAIN ARRAYS

RELATED APPLICATIONS

This application claims priority from U.S. Provisional Patent Application Ser. No. 60/735,199, filed Nov. 10, 2005, which is hereby incorporated by reference in its entirety.

FIELD OF THE INVENTION

This invention relates generally to light emitting devices, and, more particularly, to light emitting devices with multiple quantum wells (MQW).

BACKGROUND OF THE INVENTION

Commercial lighting and personal electronics such as cellular phones are fueling the rapid market growth in the LED (light emitting diode) and laser industry. Companies are now faced with the challenge of creating more effective manufacturing techniques that have a tighter control of properties and yield better quality devices.

It is known that the luminescent efficiency of visible and near-UV wavelength InGaN/GaN LEDs depends on the distribution of Indium (In) within the LED active region, which includes multiple quantum wells (MQW) and/or quantum dots. Conventional manufacturing processes, however, have poor control over the amount of In-clustering that takes place and the uniformity of the In-clusters in the MQW active region Thus, there is a need to overcome these and other problems of the prior art and to provide light emitting devices and methods for their manufacturing having better control of the In-clustering process.

SUMMARY OF THE INVENTION

According to various embodiments, the present teachings include a semiconductor device. In the semiconductor device, a first doped layer having a first conductivity type is disposed over a semiconductor substrate. A multiple quantum well (MQW) structure is then formed over the first doped layer and followed by a second doped layer formed over the MQW structure. The second doped layer has a second conductivity type opposite to the first conductivity type. A third doped layer having the second conductivity type is then formed over the second doped layer. In the semiconductor device, a nanoscale strain array is disposed within at least one of the first doped layer, the second doped layer and the third doped layer.

According to various embodiments, the present teachings also include a method for making a semiconductor device. In the method, a first doped layer having a first conductivity type is formed over a semiconductor substrate. A nanoscale strain array having the first conductivity type is then disposed within the first doped layer, over which a multiple quantum well (MQW) structure is formed. A second doped layer having a second conductivity type is then formed over the MQW structure and followed by a third doped layer having a second conductivity type formed over the second doped layer.

According to various embodiments, the present teachings also include a semiconductor laser device. The semiconductor laser device includes a laser cavity, and a laser active structure, that is disposed within the laser cavity. The laser active structure includes the semiconductor device of claim 1.

According to various embodiments, the present teachings further include a semiconductor device. In this device, an n-type GaN layer is stacked over a semiconductor substrate. A nanoscale heteroepitaxy (NHE) buffer layer is disposed between the n-type GaN layer and the semiconductor substrate. A nanoscale strain array including at least one of GaN or AlGaN is disposed within the n-type GaN layer. The strain array generates a periodic strain field. A multiple quantum well (MQW) structure including at least one of InGaN or AlInGaN is formed over the n-type GaN layer and overlapped with the periodic strain field. The device also includes a p-type AlGaN layer stacked over the MQW structure and a p-type GaN layer stacked over the p-type AlGaN layer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
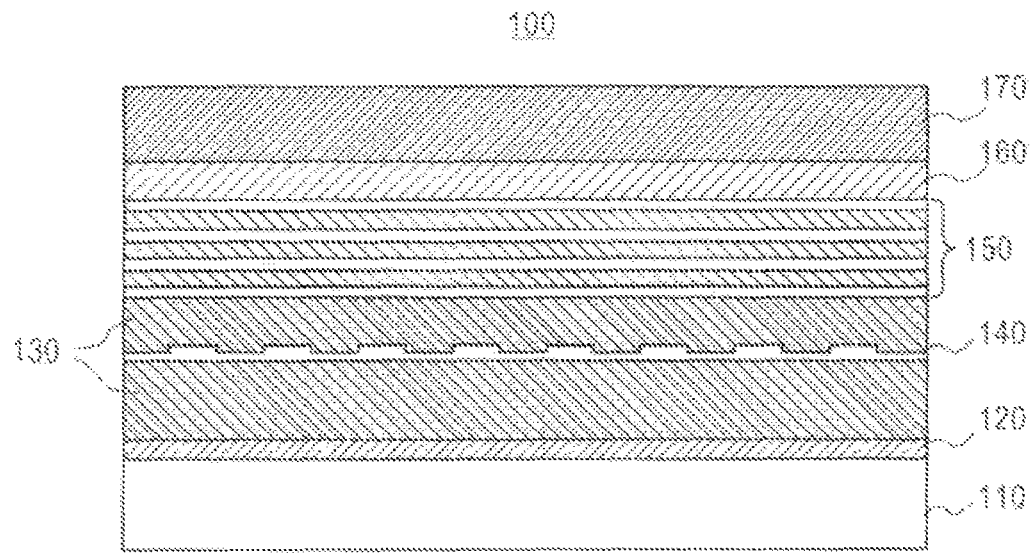
FIG. 1 depicts an exemplary MQW semiconductor device for LEDs in accordance with the present teachings.

Reference will now be made in detail to exemplary embodiments of the invention, an example of which is illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIGS. 1-5 depict exemplary embodiments of MQW semiconductor devices for the applications of, for example, LEDs and lasers, and methods for their manufacture. The MQW semiconductor devices can be formed by growing a MQW active region over a nanoscale periodic strain array. By using the nanoscale periodic strain array, the position, size, and composition of the In-rich clusters in the MQW active region can be controlled. This control of In-rich clusters can result in tighter wavelength control, which can be important for LED applications, such as, for example, color mixing.

The disclosed MQW semiconductor device can include nanoscale strain arrays and MQW active regions formed over a substrate. As used herein, the term "nanoscale strain array" refers to a nanostructured hetero-interface placed in the vicinity of the MQW active region. The nanoscale strain array can generate a periodic-strain-field in the first quantum well. The periodic-strain-field can then be propagated into subsequent quantum wells. Accordingly, once the distribution of In-rich clusters is controlled in the first quantum well, this control will be replicated in subsequent quantum wells, for example, with a similar spatial layout, leading to a stack of spatially organized In-rich clusters in the MQW active region. In this manner, the nanoscale periodic strain arrays can be used to control and/or optimize the formation, the position, and/or size of In-rich clusters within the MQW structure.

In various embodiments, the nanoscale strain arrays can be formed by, for example, one or more of interferometric lithography (IL) and/or nanoimprint lithography (NL), with periodic structures having nanoscale dimensions of, for example, about 10-100 nm. And as an additional example, the nanoscale dimensions of the periodic structures can be less than about 20 nm.

As used herein, the term "interferometric lithography" (IL) refers to a lithographic process that involves interference patterns of two (or more) mutually coherent light waves. The angles between the light propagation vectors of the waves are sufficiently large to produce an interference pattern that has a high spatial frequency.

As used herein, "nanoimprint lithography" refers to a lithographic process that involves a stamp having embossed nanostructures. The stamp can be pressed onto, for example, a resist material at high temperature and then released from the resist material when it is cooled to a low temperature. Thus, the exemplary resist material can be imprinted with the negative patterns of nanostructures of the stamp.

IL and/or NL can produce nanostructures or patterns of nanostructures over wide, macroscopic areas at low cost in comparison to other techniques such as electron beam lithography. In addition, IL or NL can be used to generate arrays of nanostructures (e.g., protrusions or channels) whose dimensions vary semi-continuously in the plane of the surface of the material being patterned. Accordingly, the IL or NL generated arrays of nanostructures can be used as nanoscale periodic strain arrays for the disclosed MQW semiconductor devices.

The MQW semiconductor devices can be formed using a variety of crystal growth techniques including, but not limited to, metal-organic chemical vapor deposition (MOCVD), molecular-beam epitaxy (MBE), gas source MBE (GSMBE), metal-organic MBE (MOMBE), atomic layer epitaxy (ALE), or organometallic vapor phase epitaxy (OMVPE). Accordingly, various epitaxial films (i.e., epilayers) can be formed over the substrate of the MQW semiconductor devices.

In various embodiments, nanoscale heteroepitaxy (NHE) techniques can be used to fabricate MQW semiconductor devices. As used herein, the term "NHE" refers to a technique for the growth of thin films in a manner which localizes and apportions strain at the substrate-epilayer interface, and enables strain to decay significantly with increasing epilayer thickness after the epitaxial film growth. Thus, the NHE techniques can be used for lattice-mismatched heteroepitaxy growth, such as, for example, lateral epitaxial overgrowth, pendeo-epitaxy and cantilever-epitaxy. In addition, the NHE techniques can provide a homogenous defect reduction across the entire wafer, for example, allowing regular, unrestricted processing on these wafers and the full cost benefits of scaleability.

In various embodiments, the MQW semiconductor devices can be formed using a III-V compound semiconductor materials system. In these materials systems, examples of the group III element can include Ga, In or Al, which can be formed from exemplary respective group III precursors, such as trimethylgallium (TMGa) or triethylgallium (TEGa), trimethylindium (TMIn) or trimethylaluminum (TMAl). In the III-V materials system, examples of the group V element can include As, Sb, N, or P. Exemplary group V precursors, such as ammonia, tertiarybutylphoshine (TBP), or arsine (AsH3) can be used to provide according exemplary element such as N, P or As. In various other embodiments, many different III-V semiconductor alloy compositions can be used, based on the known relationships between bandgap energy and lattice constant of different III-V compounds.

In the following description, III-V semiconductor alloy compositions can be described by the combination of III-V elements, such as, for example, InGaN, GaN, AlGaN, AlInGaN, InGaAs, AlGaInAs, GaNAs, InGaAsP, or GaInNAs. Generally, the elements in a composition can be combined with various molar fractions. For example, the semiconductor alloy composition InGaN can stand for $In_{(x)}Ga_{(1-x)}N$, where the molar fraction, x, can be any number less than 1.00. In addition, depending on the molar fraction value, various semiconductor devices can be made by similar compositions. For example, an $In_{0.3}Ga_{0.7}N$ (where x is about 0.3) can be used in the MQW active region of LEDs for a blue emission, while an $In_{0.43}Ga_{0.57}N$ (where x is about 0.43) can be used in the MQW active region of LEDs for a green emission.

FIG. 1 depicts an exemplary MQW semiconductor device 100 used, for example, for LEDs. The device 100 can include stacked layers including a substrate 110, a buffer layer 120, a first doped layer 130, a strain array 140, a MQW structure 150, a second doped layer 160, and a third doped layer 170. It should be readily obvious to one of ordinary skill in the art that the device 100 depicted in FIG. 1 represents a generalized schematic illustration and that other layers may be added or existing layers may be removed or modified.

The substrate 110 can be a semiconductor substrate formed of, for example, silicon, sapphire, or silicon carbide. In various embodiments, a silicon-on-insulator (SOI) can be used for the substrate 110. The buffer layer 120 can be formed over the substrate 110. The buffer layer 120 can be a NHE buffer layer, which can act as a compliant layer between the substrate 110 and the subsequent first doped layer 130.

Figure 2A:
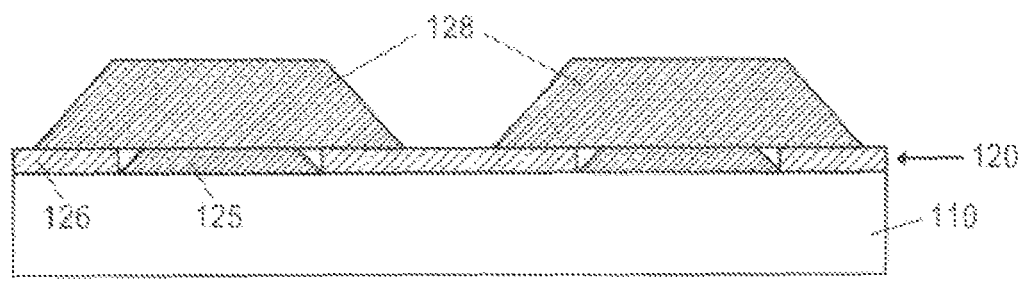
FIGS. 2A-2C depict an exemplary process for forming the NHE buffer layer and the first doped layer for the MQW semiconductor device in accordance with the present teachings.
Figure 2B:
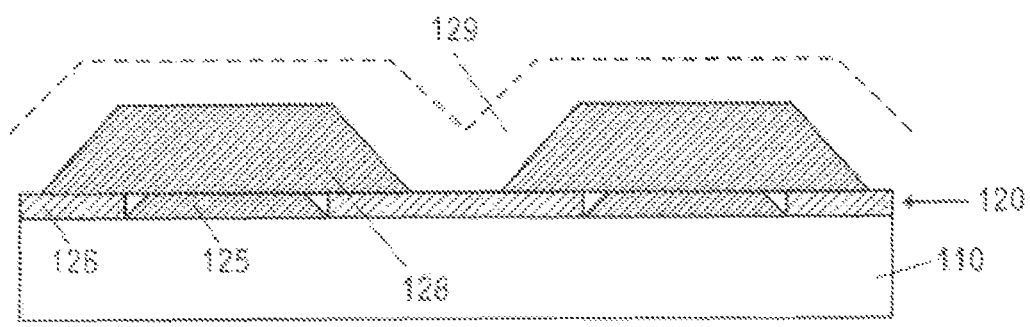
Figure 2C:
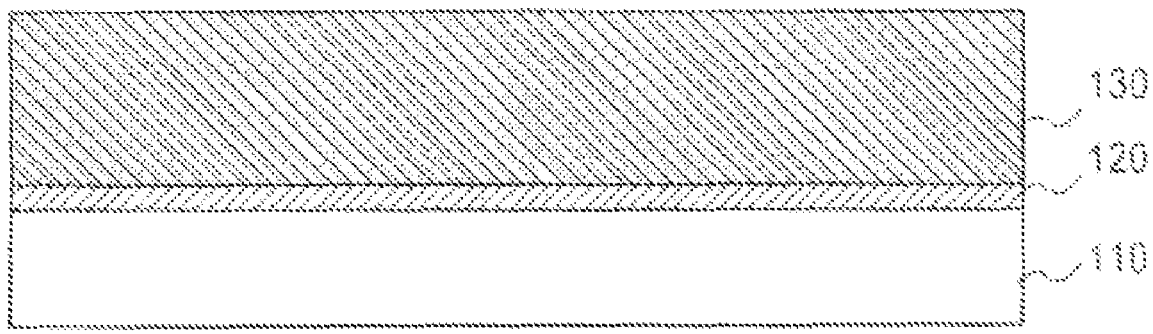

FIG. 2A-2C depicts an exemplary process for forming the NHE buffer layer 120 and the first doped layer 130. As shown in FIG. 2A, the NHE buffer layer 120 can include nanopatterned structures 125 interspersed by a selective growth mask 126 on the substrate 110. The nanopatterned structure 125 can be formed in the areas defined by the selective growth mask 126. The selective growth mask 126 can be, for example, a silicon nitride ($SiN_x$) mask. In various embodiments, the nanopatterned structure 125 can be, for example, self-assembled nanoscale pattern or nanotemplates formed by IL or NL.

Nanoscale facetted crystal pyramids 128 can then be formed from the nanopatterned structures 125 by NHE growth defined by the selective growth mask 126. In various embodiments, the nanopatterned structures 125 and the nanoscale facetted crystal pyramids 128 can be formed using same materials such as the III-V materials, for example, GaN. In an exemplary embodiment, a planar crystal layer such as a GaN layer can be inserted between the substrate 110 and the NHE buffer layer 120.

In FIG. 2B, the facetted crystal pyramids 128 can be nucleation sites for the subsequent epi growth. For example, the crystal pyramids 128 can be coalesced (depicted as 129) and then form the first doped layer 130 (shown in FIG. 2C and FIG. 1). The NHE process can allow a 3-dimentional strain relief, which allows the facetted crystal pyramids 128 to grow laterally as well as vertically to accommodate the large lattice-mismatch strain.

The first doped layer 130 can be a layer with a thickness of, for example, about 50 nm to 500 nm. The first doped layer 130 can be formed of, for example, GaN, which can be made an n-type epilayer by doping with various impurities such as silicon, germanium, selenium, sulfur and tellurium. In various embodiments, the first doped layer 130 can be made a p-type layer by introducing beryllium, strontium, barium, zinc, or magnesium. Other dopants known to one of ordinary skill in the art can be used.

Referring back to FIG. 1, the strain array 140 can be formed in the first doped epilayer 130. The strain array 140 can be formed of, for example, GaN and/or AlGaN. The strain array 140 can be further doped with an n-type or p-type conductivity similar to the first doped layer 130. In some embodiments, the strain array 140 can be a square array of 100 nm steps and 100 nm spaces (a period of 200 nm). In other embodiments, the strain array 140 can have a variety of other nanoscaled patterns, such as, for example, hexagonal lattice symmetry.

The strain array 140 can be formed by, for example, IL techniques with exemplary nanoscales of, for example, about 67 nm pitch. Suitable wavelengths for the IL process include, but are not limited to: I-line (364 nm Ar-ion laser and 355 nm tripled YAG laser); 244 nm (doubled Ar-ion); and 213/193 (fifth harmonic YAG/ArF laser for exposure in air, the minimum pitches can be, for example, about 182, 177, 122, and 107/97 nm.

The strain array 140 can also be formed using immersion IL techniques, which can extend the minimum available pitch to about 74/67 nm. The strain array 140 can further be formed using nonlinear processes, which can extend the available pitch to about 34 nm or less, and as an additional example, less than about 20 nm. Specifically, the nonlinear processes can be used in photoresist exposure and development processes, as well as in subsequent pattern transfer steps of the IL process. In addition, the nonlinear IL process can decrease threading defects and increase the density of In-rich clusters to, for example, a density of $10^{11}$ cm$^{-2}$ or higher. In various embodiments, the strain array 140 can also be formed by combining IL with NL or electron beam patterning.

In various embodiments, because of the large-area nanoscale capability, the IL techniques can be readily extended to manufacturing requirements including automatic wafer handling and extension to larger size wafers for establishing efficacy of photonic crystals for light extraction from, for example, visible and near-UV LEDs.

As shown in FIG. 1, the MQW structure 150 can be formed over the first doped layer 130 and overlapped with the strain field generated by the strain array 140. The MQW structure 150 can be formed of, for example, alternating layers of InGaN and GaN or two InGaN layers having different compositions. In various embodiments, the MQW structure 150 can be formed of alternating layers of AlInGaN and AlGaN or two AlInGaN layers having different compositions. While not intending to be bound by any theory, it is believed that the local increase in system free energy caused by the strain array 140 during formation of the MQW structure 150 relaxes the kinetic barrier to atomic diffusion of indium (In). The periodic strain field caused by the strain array 140 can penetrate at least one of the quantum wells of the MQW structure 150 to force In-clustering in a uniform array and to over-ride the self assembled In-clustering process. Once In-rich clusters form in the first quantum well, the strain field can be automatically transferred into subsequent quantum wells to replicate and/or propagate the spatial layout of In-rich clusters from the first quantum well, to the subsequent quantum well, and so on. As a result, ordered arrays of In-rich clusters can be formed.

It is believed that the stress and strain associated with the strain array 140 falls exponentially in the MQW growth direction and the extent of the exponential decrease can be similar to the period of the strain array pattern. For example, in a strain array with a 200 nm period, the strain associated with the pattern can extend about 200 nm in the MQW growth direction.

In various embodiments, because the strain field generated by the strain array 140 can be highly periodic, the position, size, and composition of the In-rich clusters can be controlled. For example, for spatial control of In-clusters, the strain field period of the strain array 140 can be controlled to be similar to the average self-assembled in-cluster-period. The In-rich clusters can be, for example, in a range of about 5-50 nm in size, and as an additional example, in the range of about 5-10 nm. The area density of the In-rich clusters can be $10^{10}$ cm$^{-2}$ or more. Therefore, the high-periodicity of IL or NL pattern arrays for the strain array 140 can improve the uniformity of In-clustering, which can lead to a more reproducible and higher-yield device process with tighter control of, for example, LED wavelength as required for color mixing.

Referring back to FIG. 1, the second doped layer 160 can also be included in the MQW semiconductor device 100 and formed over the MQW structure 150. The second doped layer 160 can be a layer with sufficient thickness to keep indium clusters within the MQW structure 150. The thickness of the layer 160 can be, for example, about 500 to about 2000 nm. The second doped layer 160 can be formed of, for example, AlGaN. The second doped layer 160 can be doped with a conductivity type similar to the third doped layer 170.

The third doped layer 170 can be formed over the second layer 160 to cap the MQW semiconductor device 100. The third doped layer 170 can be formed of, for example, GaN and doped to be an n-type or p-type. In various embodiments, if the first doped layer 130 is an n-type layer, the layer 160 and/or 170 can be a p-type layer and vice versa. The third doped layer 170 can have a thickness of about 50-500 nm.

Figure 3:
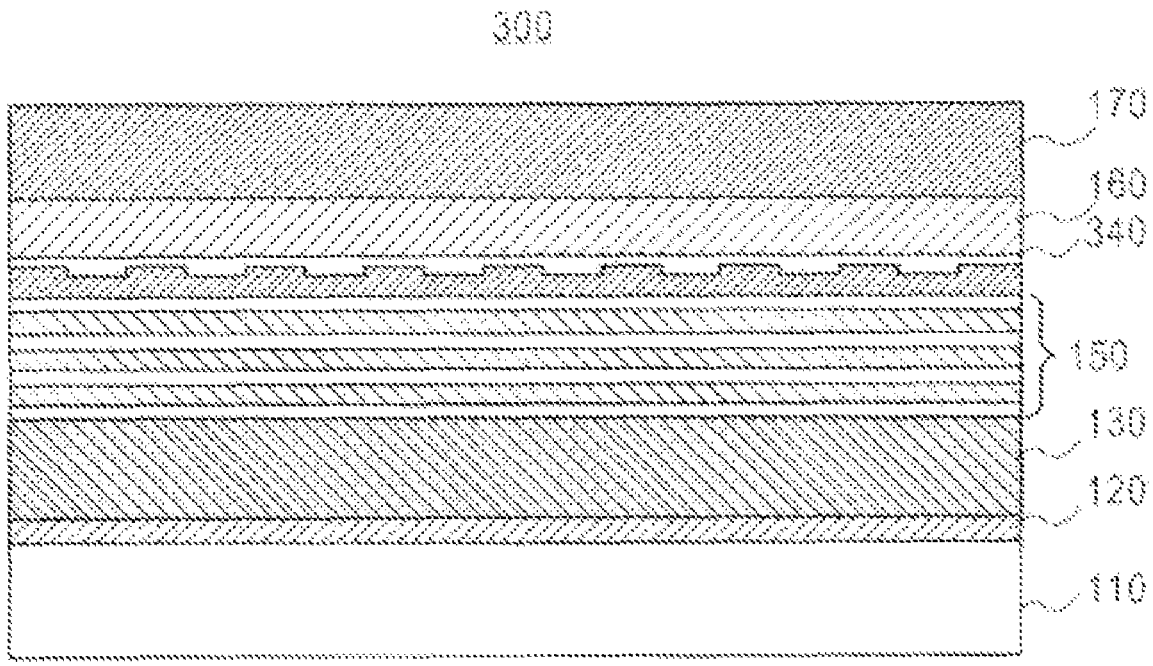
FIG. 3 depicts an alternative exemplary MQW semiconductor device in accordance with the present teachings.

In various embodiments, ordered In-clusters in the MQW active region an be achieved by correctly placing the strain array 140 in the vicinity of the MQW structures 150, for example, as shown in FIG. 1. In another exemplary embodiment, the strain array can be disposed on an opposite side of the MQW structure. FIG. 3 depicts an alternative exemplary MQW semiconductor device 300, in which the strain array 340 is disposed within the second doped layer 160, as opposed to being disposed within the first doped layer 130 in the MQW semiconductor device 100. However, one of ordinary skill will recognize that the strain array can also be disposed within the third doped layer 170. In this case, post-growth annealing would probably be required to allow the strain array to exert its influence and re-organize the In-clustering in the MQW region below it.

Figure 4:
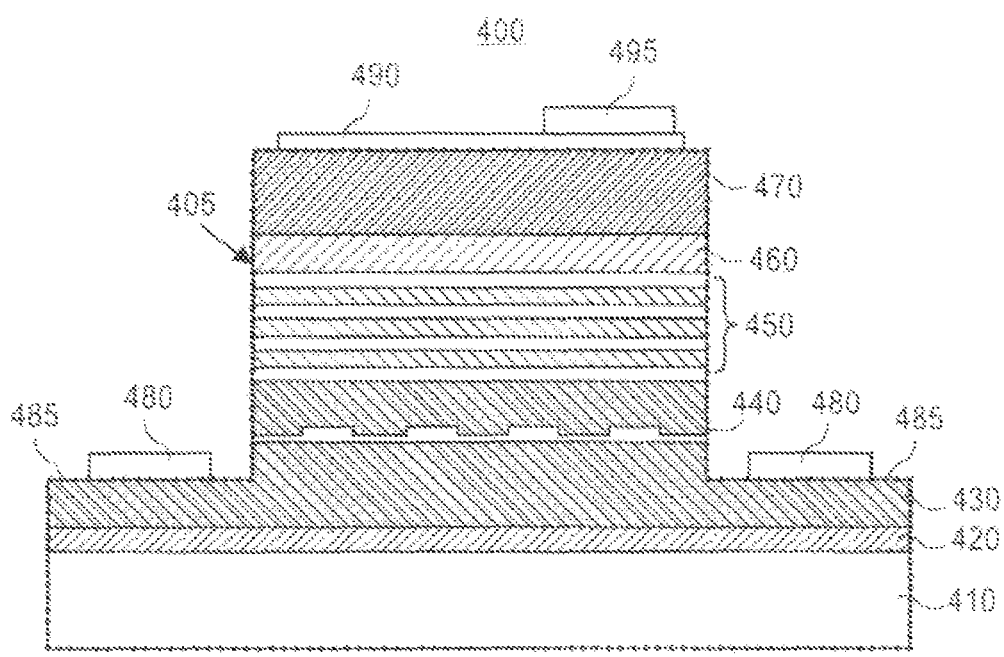
FIG. 4 depicts an additional exemplary MQW semiconductor device in accordance with the present teachings.

In various embodiments, electrodes and/or electrical contacts can be added to the MQW semiconductor devices. FIG. 4 depicts an additional exemplary MQW semiconductor device 400. It should be readily obvious to one of ordinary skill in the art that the device 400 depicted in FIG. 4 represents a generalized schematic illustration and that other layers/dopants may be added or existing layers/dopants may be removed or modified.

As shown in FIG. 4, the MQW semiconductor device 400 can include conductive structures/layers formed over an etched exemplary MQW layered structure 405. The structure 405 can be similar to the structure of the semiconductor device 100 or the semiconductor device 300. Specifically, the etched layered structure 405 can include a substrate 410, an NHE buffer layer 420, an n-type layer 430, a strain array 440, a MQW structure 450, an n-type barrier layer 460, and a p-type layer 470. Each layer can be epitaxially grown on the layer below in sequential fashion as described above. In various embodiments, the semiconductor device 400 can invert the vertical positions of the p-type and n-type layers.

As illustrated in FIG. 4, the conductive structures of the MQW semiconductor device 400 can include n electrodes 480, a transparent p electrode 490, and a p-bond pad 495 fabricated on surfaces of the etched layered structure 405. Each of conductive structures can be formed from titanium (Ti), aluminum (Al), platinum (Pt), nickel (Ni) or gold (Au) in a number of multi-layered combinations such as Al/Ti/Pt/Au, Ni/Au, Ti/Al, Ti/Au, Ti/Al/Ti/Au, Ti/Al/Au, Al or Au. In various embodiments, the n electrodes 480 and the p-bond pad 495 can be used as ohmic contacts.

The n electrodes 480 can be formed on surface of the n layer 430 by first etching the layered structure 405 and forming mesa structures 485 using standard ICP (i.e., inductively coupled plasma) mesa etch techniques known to one of ordinary skill in the art. The n electrodes 480 can then be patterned on the surface of the etched n layer 430 (i.e., the mesa structures 485) by metallization processes, for example, metal evaporation or deposition. In various embodiments, the n electrodes 480 can be annealed after the metallization process at a high temperature, for example, about 700-800° C. The n electrodes 480 can be formed of, for example, a layered metal combination, such as Al/Ti/Pt/Au.

The p electrode 490 can be a transparent layer formed on a surface of the etched layered structure 405, more particularly, on the surface of the p layer 470. The p bond pad 495 can then be patterned on top of the transparent p electrode 490. In various embodiments, metallization processes and annealing process can be used to form both the p electrode 490 and the p bond pad 495. The p electrode 490 and the p-bond pad 495 can be formed using the same materials, such as, for example, a layered metal combination of Ni/Au.

Figure 5:
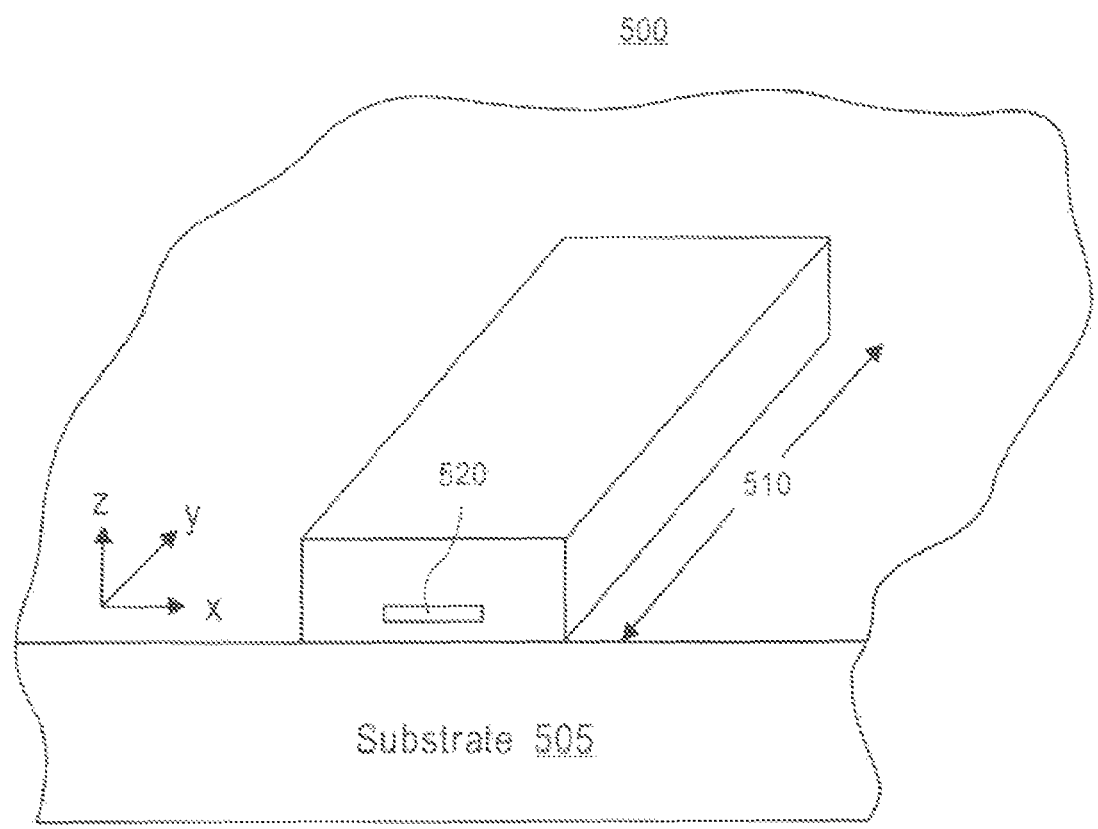
FIG. 5 depicts an exemplary semiconductor laser device in accordance with the present teachings.

In various embodiments, the disclosed layered structure in FIGS. 1-4 can be used in the application of, for example, LEDs and/or lasers. FIG. 5 depicts an exemplary semiconductor laser device 500 including a substrate 505, a laser cavity 510 and a laser active structure 520. The laser active structure 520 can be configured within the laser cavity 510, which can be configured over the substrate 505.

The substrate 505 can be any III-V compound semiconductor substrate, such as, for example, GaAs, InP or other similar material.

The laser cavity 510 shown is a cross-section for a lateral laser cavity, which can be used in, for example, edge emitting lasers. In other embodiments, the laser cavity 510 can be a vertical laser cavity configured in, for example, vertical cavity emitting lasers. The laser cavity 510 can be oriented to provide an optical cavity mode for the semiconductor laser device 500. In various embodiments, the length of laser cavity 510 can be 100 microns or more. In various embodiments, the length of the laser cavity 510 can be several hundred microns long.

The laser active structure 520 can be a layered structure similar to the devices described in FIGS. 1-4 including a substrate 110, a buffer layer 120, a first doped layer 130, a MQW structure 150, a second doped layer 160, and a third doped layer 170. Likewise, a nanoscale strain array can be included in the laser active structure 520 and disposed within at least one of the first doped layer 130, the second doped layer 160 and the third doped layer 170. In addition, laser facets, e.g., with high reflection, can be formed (e.g., coated) on the sides of the laser active structure 520 for laser operations known to one of ordinary skill in the art.

The laser active structure 520 can be configured within the laser cavity 510, for example, in a manner to provide a small periodic gain and refractive index variation along the laser cavity 510 by turning the nanoscale strain array to a standing wave period in the laser active structure 520. This can potentially be used to fix the phase of the standing wave within the laser cavity 510.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for making a semiconductor device comprising:
    forming a first doped layer having a first conductivity type over a semiconductor substrate;
    forming a nanoscale strain array having the first conductivity type within the first doped layer;
    forming a multiple quantum well (MQW) structure over the first doped layer;
    forming a second doped layer having a second conductivity type over the MQW structure; and
    forming a third doped layer having the second conductivity type over the second doped layer.

2. The method of claim 1, further comprising forming a nanoscale heteroepitaxy (NHE) buffer layer between the first doped layer and the semiconductor substrate.

3. The method of claim 1, wherein the nanoscale strain array is formed by one or more of nanoimprinting lithography, interferometric lithography, immersion interferometric lithography, and nonlinear interferometric lithography.

4. The method of claim 1, wherein forming the nanoscale strain array comprises forming an array of steps and spaces.

5. The method of claim 1, wherein forming the multiple quantum well (MQW) structure over the first doped layer comprises forming a plurality of ordered In-rich clusters.

6. The method of claim 1, wherein the semiconductor device further comprises one or more of light emitting diodes (LEDs) and lasers.

* * * * *